(12) United States Patent
Kang et al.

(10) Patent No.: US 8,148,727 B2
(45) Date of Patent: Apr. 3, 2012

(54) DISPLAY DEVICE HAVING OXIDE THIN FILM TRANSISTOR AND FABRICATION METHOD THEREOF

(75) Inventors: Im-Kuk Kang, Seoul (KR); Dae-Won Kim, Goyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/166,478

(22) Filed: Jun. 22, 2011

(65) Prior Publication Data

US 2011/0248262 A1 Oct. 13, 2011

Related U.S. Application Data

(62) Division of application No. 12/649,880, filed on Dec. 30, 2009, now Pat. No. 7,989,274.

(30) Foreign Application Priority Data

Jun. 2, 2009 (KR) .................. 10-2009-0048778

(51) Int. Cl.
*H01L 29/04* (2006.01)
*H01L 31/036* (2006.01)
*H01L 31/0376* (2006.01)
*H01L 31/20* (2006.01)

(52) U.S. Cl. .................. 257/59; 257/72; 257/E29.117

(58) Field of Classification Search .................. 257/59, 257/72, 347, E29.117, E29.273
See application file for complete search history.

(56) References Cited

U.S. PATENT DOCUMENTS 7,781,268 B2  8/2010  Byun et al.
2006/0113903 A1*  6/2006  Kim .............................. 313/506

* cited by examiner

*Primary Examiner* — Hoai V Pham
(74) *Attorney, Agent, or Firm* — Brinks Hofer Gilson & Lione

(57) ABSTRACT

A display device including an oxide thin film transistor (TFT) is disclosed. A nitride-based gate insulating layer of a gate pad area is etched when an oxide semiconductor layer of a pixel area is etched by using a half-tone mask, a metal layer is formed at a contact hole of the etched gate insulting layer, and then a passivation layer formed thereon is etched. Thus, an overhang of the passivation layer can be prevented from being generated when the gate insulating layer is etched, and accordingly, the fabrication process can be simplified.

5 Claims, 6 Drawing Sheets

DISPLAY DEVICE HAVING OXIDE THIN FILM TRANSISTOR AND FABRICATION METHOD THEREOF

The present patent document is a divisional of U.S. patent application Ser. No. 12/649,880, filed Dec. 30, 2009 now U.S. Pat. No. 7,989,274, which claims priority to Korean Patent Application No. 10-2009-0048778 filed in Korea on Jun. 2, 2009, which is hereby incorporated by reference.

BACKGROUND

1. Field of the Invention

The present disclosure relates to a display device having an oxide thin film transistor (TFT) and its fabrication method and, more particularly, to a display device having an oxide TFT capable of simplifying a fabrication process and reducing a fabrication cost by forming a source metal layer on a gate pad, and its fabrication method.

2. Discussion of the Related Art

Recently, the development of diverse portable electronic devices such as mobile phones, personal digital assistants (PDAs), notebook computers, etc., has lead to an increase in the demand for a high picture quality large display devices as well as a light, thin, short, and small display devices, and thus, flat panel display (FED) devices are commonly used. The FEDs include a liquid crystal display (LCD) or a plasma display device (PDP), and currently, the LCD receives much attention as it can be mass-produced, has a driving unit that can be easily driven, implement a high picture quality, and drives the driving unit at low power consumption.

The LCD includes a color filter substrate, an array substrate, and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

The structure of the general LCD will now be described with reference to FIG. 1.

FIG. 1 is an exploded perspective view schematically showing the general LCD. As shown in FIG. 1, the LCD includes a color filter substrate 5, an array substrate 10, and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 demarcating the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective crossings of the gate lines 16 and the data lines 17, and pixel electrodes 18 formed at the pixel areas (P).

A gate pad 18 and a data pad 19 are formed at each of end portions of the gate lines 16 and the data lines 17. A gate driving circuit and a data driving circuit are connected with the gate pad 18 and the data pad 19 to apply a scan signal and an image signal through the gate lines 16 and the data lines 17.

The color filter substrate 5 and the array substrate 10 are attached in a facing manner by a sealant (not shown) formed at edges of an image display area of the color filter substrate 5 and the array substrate 10 to form a liquid crystal panel, and the attachment of the color filter substrates 5 and the array substrate 10 is made by an attachment key formed on the color filter substrate 5 or the array substrate 10.

The LCD largely uses amorphous silicon as a switching element. Because the amorphous silicon incurs a low fabrication cost and can be fabricated at a low temperature, it is commonly used as the switching element of the LCD.

However, amorphous silicon is a very small mobility and has bad electrostatic properties, so when it is used in fabricating a large high quality display device, its picture quality is degraded. Thus, as a solution to the problem, TFTs are fabricated with polycrystalline silicon, but the TFTs made of polycrystalline incurs a high fabrication cost, has difficulty in having uniform characteristics when a large scale display device is intended, and needs to perform its process at a high temperature. In addition, like the amorphous silicon, the polycrystalline silicon has poor electrostatic properties.

Thus, in an effort to solve the problem, recently, an oxide TFT using oxide semiconductor has been proposed. A fabrication process of the oxide TFT is performed at a low temperature and the oxide TFT has better electrostatic properties compared with the polycrystalline silicon. Thus, the oxide TFTs have an advantage in that when they are applied to an LCD, they can have uniform characteristics at a low cost.

FIG. 2 is a sectional view of the LCD of FIG. 1, showing the structure of the LCD having an oxide TFT as a switching element. In the drawing, a pixel area where an image is actually implemented and a pad area connected with an external driving circuit to apply a signal to the pixel area are shown to be divided for the sake of brevity.

As shown in FIG. 2, the LCD includes first and second substrates 20 and 40 which face each other, and a liquid crystal layer 30 formed between the first and second substrates 20 and 40.

The first substrate 20 is an array substrate, an oxide TFT (T) is formed on a pixel area of the array substrate. The TFT (T) includes a gate electrode 21 formed on the first substrate 20, a gate insulating layer 26 formed on the entire surface of the first substrate 20 to cover the gate electrode 21, an oxide semiconductor layer 22 formed on the gate insulating layer 26, and a source electrode 23 and a drain electrode 24 formed on the oxide semiconductor layer 22. A passivation layer 30 is formed on the entire surface of the first substrate 20 to cover the TFT (T).

On the first substrate 20 of the pad area, there are formed a gate pad 18 and a transparent conductive layer 29a formed on the gate pad 18 to prevent the gate pad 18 from being oxidized during a process. Although not shown, a data pad and a transparent conductive layer are formed on the gate insulating layer 26 of the pad area, to which an external signal is inputted.

A pixel electrode 29 is formed on the passivation layer 28. It is electrically connected with the drain electrode 24 of the TFT via a contact hole formed at the passivation layer 28 to apply an image signal through the oxide TFT (T).

The color filter layers 7 implementing an actual color are formed on a pixel area of the second substrate 20, and black matrixes 42 blocking light transmission to the non-display area of the pixel area and the pad area.

However, the related art LCD device having such oxide semiconductor layer has the following problems.

That is, in these LCD devices, the gate insulating layer 26 is made of a nitride inorganic insulating material such as $SiN_x$, and the passivation layer 28 is made of an oxide organic insulating material such as $SiO_2$. The reason for using $SiN_x$ as the material of the gate insulating layer 26 and $SiO_2$ as the material of the passivation layer 28 is as follows. A channel layer where electrons flow actually in the oxide semiconductor layer 22 is formed along the upper surface of the oxide semiconductor layer 22. Thus, if SiNx, not SiO2, is used as a material of the passivation layer 28 in contact with the upper surface of the oxide semiconductor layer 22, oxygen is captured to the passivation layer 28 from the interface of the oxide semiconductor layer 22 and the passivation layer 28 to degrade crystallinity (i.e., crystalline properties) in the vicinity of the interface (namely, in the vicinity of the upper surface of the oxide semiconductor layer 22). The degradation of such crystallinity brings about degradation of electric conductivity of the corresponding area, so the characteristics of the oxide TFT deteriorate. For this reason, the gate insulating layer 26 of the oxide TFT is made of the nitride inorganic insulating material such as SiNx and the passivation layer 28 is made of an oxide organic insulating material such as SiO2.

In this case, the nitride inorganic insulating material is etched by a dry etching method, while the oxide organic insulating material is etched by a wet etching method. Thus, the difference in the etching method causes a problem in the process when the gate insulating layer 26 and the passivation layer 28 at the pad area. FIGS. 3a to 3e show the process of etching the gate insulating layer 26 and the passivation layer 28. Substantially, the gate insulating layer 26 and the passivation layer 28 are etched in the process of forming a contact hole for electrically connecting the drain electrode 23 and the pixel electrode 29 of the oxide TFT (T) after the oxide TFT (T) of the pixel area is formed, but, for the sake of brevity, only the etching of the gate insulating layer 26 and the passivation layer 28 at the pad area will be described with reference to the drawings.

With reference to FIG. 3a, a photoresist layer 54a is formed on the gate insulating layer 26 and the passivation layer 28 deposited on the first substrate 20 of the pad area, and developed by using a photo mask to form a photoresist pattern 54b as shown in FIG. 3b. Subsequently, an etching solution is applied with the passivation layer blocked with the photoresist pattern 54b to etch the passivation layer 28.

Then, when an etching gas is applied to the exposed gate insulating layer 26 as shown in FIG. 3c, the gate insulating layer 26 is etched to make the gate pad 18 exposed as shown in FIG. 3d. In this case, when the gate insulating layer 26 is etched by using the etching gas, the gate insulating layer 26 is isotropic-etched, generating an undercut at the gate insulating layer 26 below the passivation layer 28 as shown in FIG. 3d, so an overhang (A) is generated at the passivation layer 28.

The overhang (A) of the passivation layer 28 causes a transparent conductive layer 29a to be disconnected when the transparent conductive layer 29a is formed in a follow-up process, so as shown in FIG. 3d, the etching solution is applied to etch out the overhang (A) formed at the passivation layer 28.

Thereafter, as shown in FIG. 3e, a transparent conductive material is deposited on the overhang (A)-removed passivation layer 28 to form the transparent conductive layer 29a.

As described above, in the related art LCD having the oxide TFT, in the gate pad 18 by etching the gate insulating layer 26 and the passivation layer 28 formed over the gate pad 18, the process of removing the overhang (A) formed at the passivation layer 28, as well as the etching process of the gate insulating layer 26 and the etching process of the passivation layer 28, is additionally performed.

BRIEF SUMMARY

A method for fabricating a display device, includes: providing first and second substrates including a pixel area, a gate pad area, and a data pad area; forming a gate electrode at the pixel area of the first substrate and a gate pad at the gate pad area of the first substrate; depositing a nitride-based gate insulating material and an oxide semiconductor material on the entire surface of the first substrate; etching the oxide semiconductor material at the pixel area to form an oxide semiconductor layer over the gate electrode, etching the oxide semiconductor material and an the gate insulating material at the gate pad area to expose a gate pad, and etching the oxide semiconductor material at the data pad area; forming source and drain electrodes on the oxide semiconductor layer of the pixel area, forming a metal layer on exposed gate pad of the gate pad area and on the gate insulating layer, and forming a data pad at the data pad area; forming a passivation layer on the entire surface of the first substrate and etching the passivation layer to form contact holes at the passivation layer on the drain electrode, the metal layer and the data pad; forming and etching a transparent conductive layer to form a pixel electrode connected with the drain electrode at the pixel area and forming a transparent conductive layer on the metal layer and the data pad of the data pad area; and attaching the first and second substrates with a liquid crystal layer interposed therebetween.

According to another aspect, there is provided a display device including: first and second substrates including a pixel area, a gate pad area, and a data pad area; an oxide thin film transistor (TFT) formed at the pixel area of the first substrate, the oxide thin film transistor including a gate electrode on the first substrate, a gate insulating layer on the whole area of the first substrate, an oxide semiconductor layer on the gate insulating layer, and source and drain electrodes on the oxide semiconductor layer; a gate pad and a data pad at the gate pad area and the data pad area of the first substrate; a metal layer on the gate insulating layer at the gate pad area and connected with the gate electrode via a contact hole in the gate insulating layer; a passivation layer on the whole area of the first substrate; a pixel electrode on the passivation layer of the pixel area; first and second transparent conductive layers at the gate pad area and the data pad area, respectively; and a liquid crystal layer between the first and second substrates.

According to an exemplary embodiment of the present invention, because a metal layer is formed between a gate insulating layer and a passivation layer of a gate pad area to prevent the generation of an overhang at the passivation layer when the gate insulating layer and the passivation layer are etched, the process can be simplified and the fabrication cost can be reduced.

The foregoing and other objects, features, aspects and advantages of the present invention will become more apparent from the following detailed description of the present invention when taken in conjunction with the accompanying drawings.

DETAILED DESCRIPTION OF THE DRAWINGS AND THE PRESENTLY PREFERRED EMBODIMENTS

A display device having an oxide thin film transistor (TFT) and its fabrication method according to exemplary embodiments of the present invention will now be described with reference to the accompanying drawings.

Oxide semiconductor has an Ion/Ioff ratio of about 105-107 as well as having mobility larger by 10 to 100 times that of amorphous silicon, exhibiting excellent semiconductor characteristics. Also, oxide semiconductor has a band gap of about 3.2 to 3.4 eV, larger than that of amorphous semiconductor layer, so even when visible light is irradiated to the oxide semiconductor, little leakage current is generated, advantageously.

In an exemplary embodiment of the present invention, with such advantages, when the oxide TFT is applied to a display device, the process is simplified by forming a metal layer between a gate insulating layer and a passivation layer on a gate pad.

Namely, the metal layer is formed between the nitride-based gate insulating layer and the oxide-based passivation layer to make the gate insulating layer and the passivation layer discontinuous, whereby etching of the gate insulating layer and that of the passivation layer are not affected each other to thereby simplify the process.

The configuration of the present invention can be employed for any display device, for example, a liquid crystal display (LCD) device, an organic light emitting diode (OLED) display device, and the like, which uses TFTs as switching elements. In the following description, the LCD device will be described for the sake of brevity.

Figure 1:
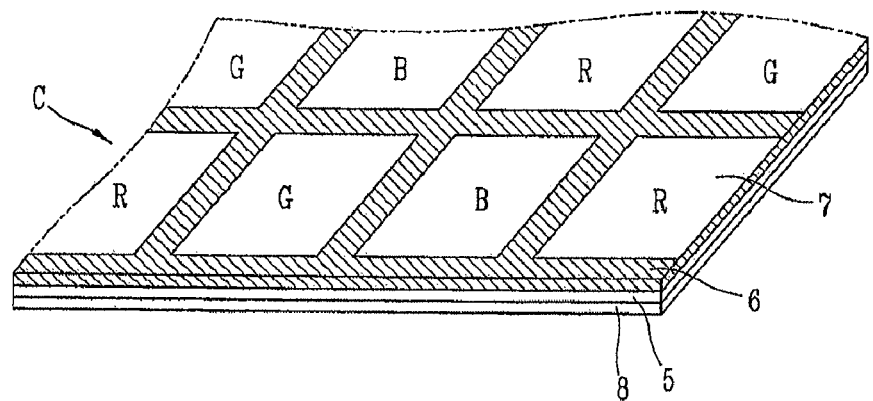
FIG. 1 is an exploded perspective view schematically showing a general liquid crystal display (LCD) device.
Figure 1:
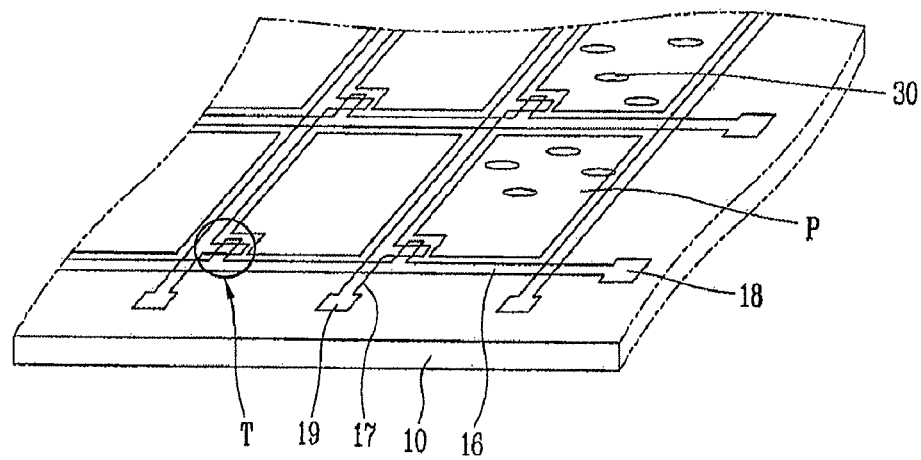
Figure 2:
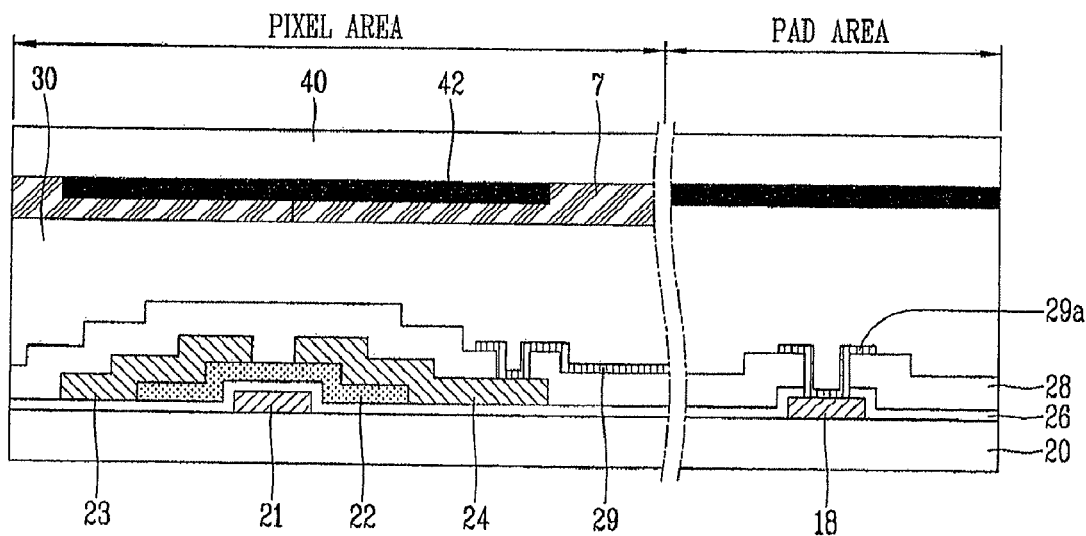
FIG. 2 is a sectional view showing the structure of the general LCD device having an oxide thin film transistor (TFT)
Figure 3A:
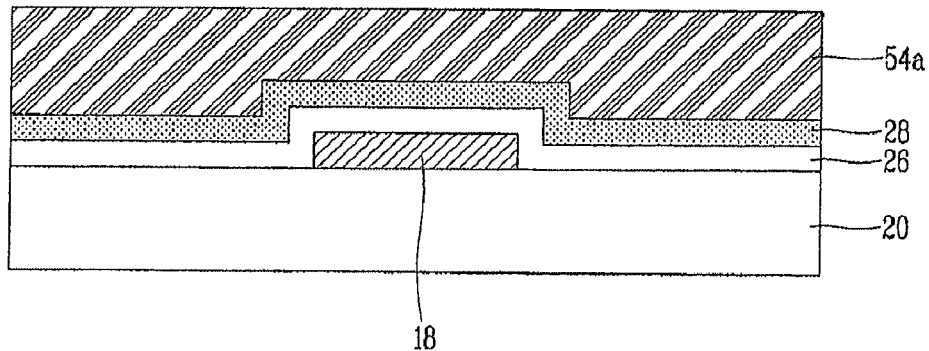
FIGS. 3a to 3e illustrate the fabrication process of a gate pad area of the general LCD having the oxide TFT.
Figure 3B:
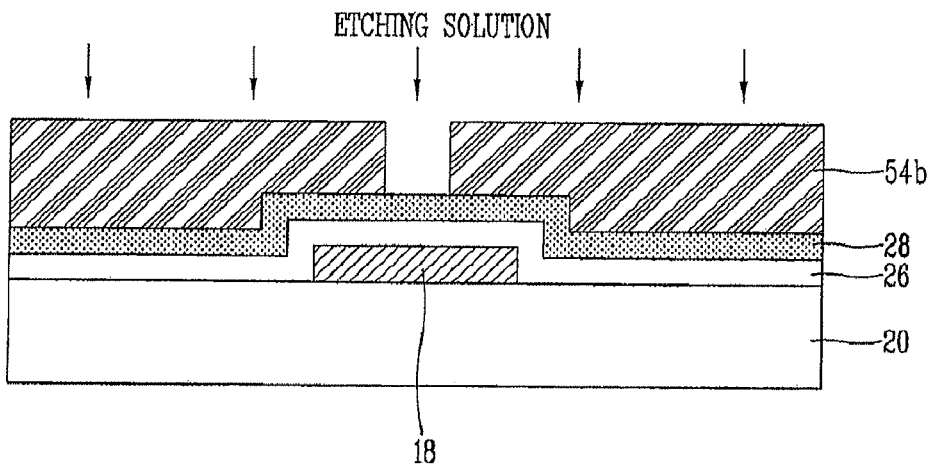
Figure 3C:
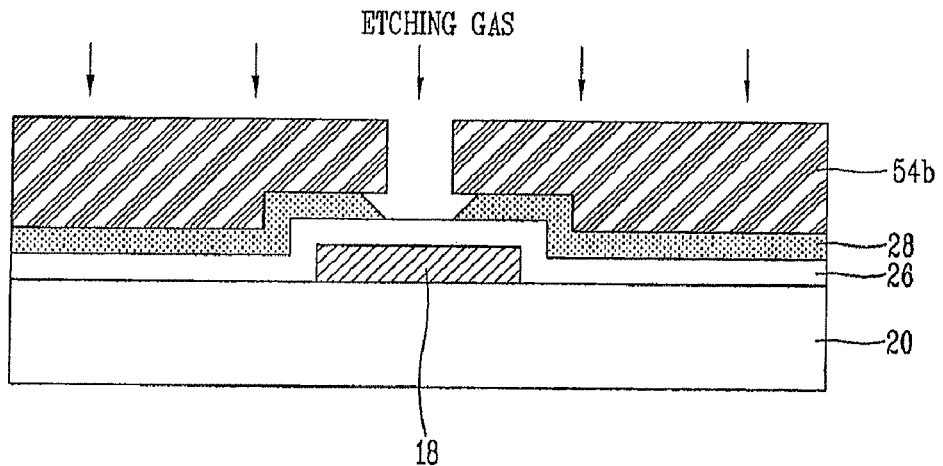
Figure 3D:
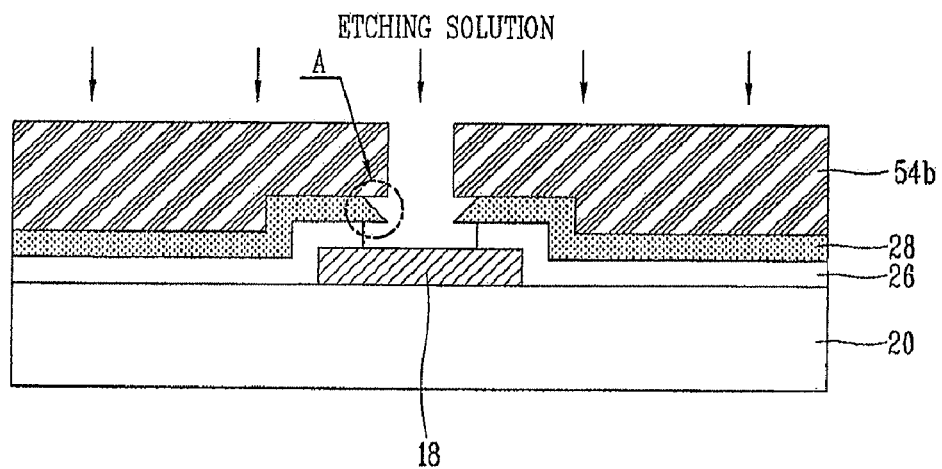
Figure 3E:
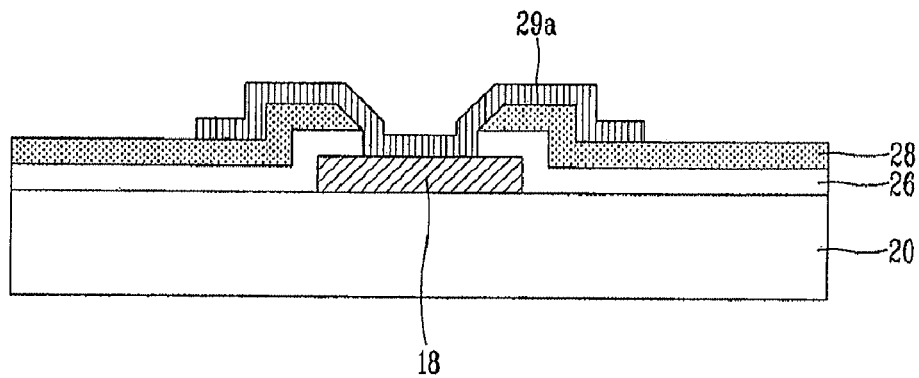
Figure 4:
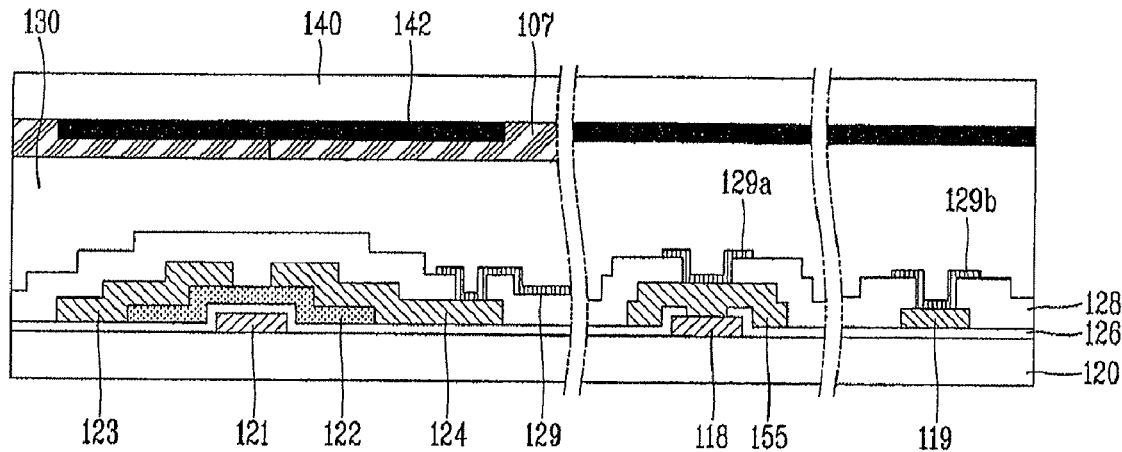
FIG. 4 is a sectional view showing the structure of an LCD device having an oxide TFT according to an exemplary embodiment of the present invention.

FIG. 4 is a sectional view showing the structure of an LCD device having an oxide TFT according to an exemplary embodiment of the present invention. A pixel area, a gate pad area, and a data pad area are discriminated and described.

As shown in FIG. 4, the LCD according to an exemplary embodiment of the present invention includes a first substrate 120, a second substrate 140, and a liquid crystal layer 30 formed between the first and second substrates 120 and 140.

An oxide TFT (T) is formed at the pixel area of the first substrate 20. The TFT (T) includes a gate electrode 121 formed on the first substrate 120, an oxide semiconductor layer 122 formed on the gate insulating layer 126, and a source electrode 123 and a drain electrode 124 formed on the oxide semiconductor layer 122. A passivation layer 128 is formed on the entire surface of the first substrate 120 to cover the TFT (T).

The oxide semiconductor layer 122 is made of an oxide semiconductor material. As the oxide semiconductor material, an oxide including Zn, In, Ga, or their mixture, and the like, may be used.

The gate insulating layer 126 may be made of various inorganic insulating materials such as SiNx or SiO2, and for the interface characteristics between the first substrate 120 and the gate electrode 121, the gate insulating layer 126 may be formed by depositing SiNx.

A pixel electrode 129 made of a transparent conductive material is formed on the passivation layer 128. The pixel electrode 129 is electrically connected with the drain electrode 124 of the oxide TFT (T) via a contact hole formed at the passivation film 128. An image signal from an external source is applied via the oxide TFT (T) to the pixel electrode 129.

The passivation layer 128 may be made of various inorganic insulating materials such as a nitride-based inorganic insulating material or an oxide-based inorganic insulating material such as SiNx or SiO2. Preferably, the oxide-based insulating material such as SiO2 is used for the crystallinity of a channel region of the oxide semiconductor layer 122 in contact with the passivation layer 128. Namely, if the nitride-based insulating material such as SiNx is used, oxygen of the oxide semiconductor layer 122 in contact with the passivation layer 128 is introduced to the passivation layer 128 made of the nitride-based insulating material to degrade crystallinity of the oxide semiconductor layer 122 at the interface with the passivation layer 128. When the oxide TFT is fabricated the channel region of the oxide semiconductor layer is formed near the interface with the passivation layer 128. Thus, the degradation of the crystallinity of the region would degrade conductivity of the channel area to degrade the characteristics of the oxide TFT. Thus, the passivation layer 128 is preferably made of the oxide-based insulting material.

Also, a gate pad 118 is formed on the first substrate 120 of the gate pad area. The gate pad 118 connects a gate line formed at the pixel area and an external gate driving circuit to apply a scan signal outputted from the gate driving circuit to the TFT (T). The gate pad 118 may be made of a different metal from that of the gate electrode 121 of the oxide TFT (T), but preferably, it is made of the same metal for the purpose of simplifying the process.

The gate pad 118 is covered by the gate insulating layer 126. Portions of the gate insulating layer 126 and the passivation layer 128 are removed to form a hole. A metal layer 155 is formed on the gate insulating layer 126 and on the gate pad 118. The metal layer 115 may be made of a metal different from that of the source electrode 123 and the drain electrode 124 of the oxide TFT (T), but preferably, it is made of the same metal for the purpose of simplifying the process.

A data pad 119 is formed on the gate insulating layer 126 of the first substrate 120 of the data pad area. The data pad 119 connects a data line formed at the pixel area and an external data driving circuit to apply an image signal outputted from the data driving circuit to the pixel electrode 129 via the TFT (T). The data pad 119 may be made of a different metal from that of the source electrode 123 and the drain electrode 124, but preferably, it is made of the same metal for the purpose of simplifying the process.

First and second transparent conductive layers 129a and 129b are formed on the passivation layer 128 of the gate pad area and the data pad area, respectively. The first and second transparent conductive layers 129a and 129b are made of a transparent conductive material such as indium tin oxide (ITO) or indium zinc oxide (IZO) and formed to prevent the gate pad 11 and the data pad 119 from being exposed to be oxidized during the process. The first and second transparent conducive layers 129a and 129b may be formed separately from the process of the pixel area, but preferably, they are formed at the same time when the pixel electrode 129 of the pixel area is formed for the purpose of simplifying the process.

A color filter layer 107 implementing actual color is formed at the pixel area of the second substrate 140, and a black matrix 142 for blocking light transmission is formed at the non-image display area, the gate pad area and the data pad area of the pixel area.

In the present exemplary embodiment, the metal layer 155 is formed on the gate insulating layer 126 and the gate pad 118 of the gate pad area. The metal layer 155 is formed to simplify the fabrication process of the LCD device. Hereinafter, the fabrication process of the LCD device including the metal layer 155 will now be described.

FIGS. 5*a* to 5*h* illustrate a method for fabricating the LCD device having an oxide TFT according to an exemplary embodiment of the present invention.

Figure 5A:
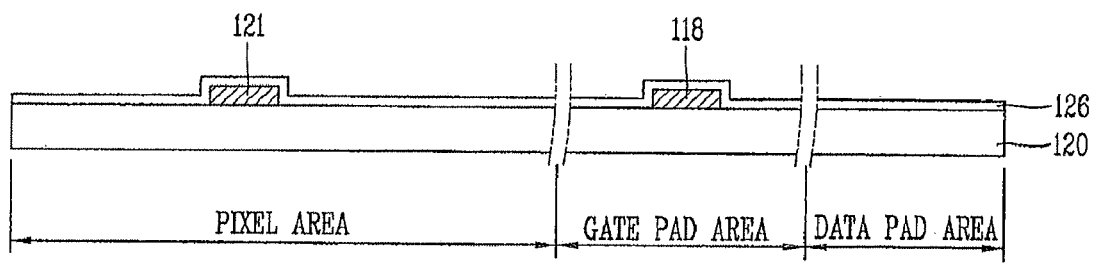
FIGS. 5a to 5h illustrate a method for fabricating the LCD device having an oxide TFT according to an exemplary embodiment of the present invention.

First, as shown in FIG. 5*a*, metal such as Al, an Al alloy such as AlNd, Cu, Mo, Ta, Au, etc., is deposited on the entire surface of the first substrate 120 made of a transparent insulating material such as glass through a sputtering method and then etched to form the gate electrode 121 at the pixel area and the gate pad 118 at the gate pad area. In this case, the gate pad 118 may be formed by using a different metal through a separate process, but preferably, the gate pad 118 is made of the same metal during the same process for the purpose of simplifying the process and reducing the cost. Next, an inorganic insulating material such as SiNx is deposited on the entire surface of the first substrate 120 with the gate electrode 121 and the gate pad 118 formed thereon through a plasma enhance chemical vapor deposition (PECVD) to form the gate insulating layer 126.

Figure 5B:
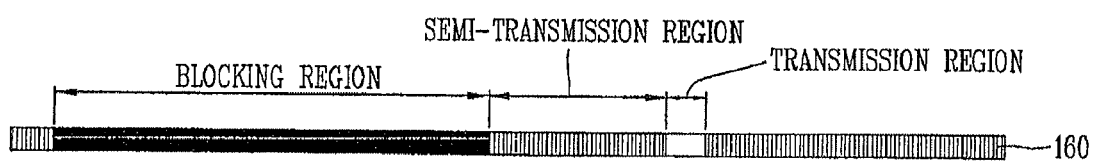

And then, as shown in FIG. 5*b*, an oxide semiconductor material is deposited on the entire surface of the first substrate 120 to form the oxide semiconductor layer 154*a* on the gate insulating layer 126. The oxide semiconductor layer 154*a* is formed by depositing oxide containing Zn, In, Ga, or their mixture on the gate insulating layer 126 according to a sputtering method, a pulse laser deposition method, a molecular-beam epitaxy method, a printing method, a spin coating method, an atomic layer deposition method, a metal organic chemical vapor deposition method, and the like.

Subsequently, photoresist is deposited on the oxide semiconductor layer 154 to form a photoresist layer, and a mask 160 is positioned thereon. The mask 160 is a half-tone mask or a slit mask having a blocking region for blocking light (or ultraviolet ray), a semi-transmission region allowing only a portion of light to be transmitted therethrough, and a transmission region allowing entire light to be transmitted therethrough. The blocking region is formed to correspond to the area where the TFT of the pixel area is formed, the transmission region is formed to correspond to the gate pad 118, and the translucent region is formed to correspond to other area than the blocking region and the transmission region.

With the half-tone mask 160 positioned on the first substrate 120, light such as ultraviolet ray is irradiated thereto and a developer is applied. Then, the photoresist at the area corresponding to the transmission region is completely removed, the photoresist at the area corresponding to the translucent region is removed by a half of its entire thickness, and the photoresist at the area corresponding to the blocking region remains as it is.

Figure 5C:
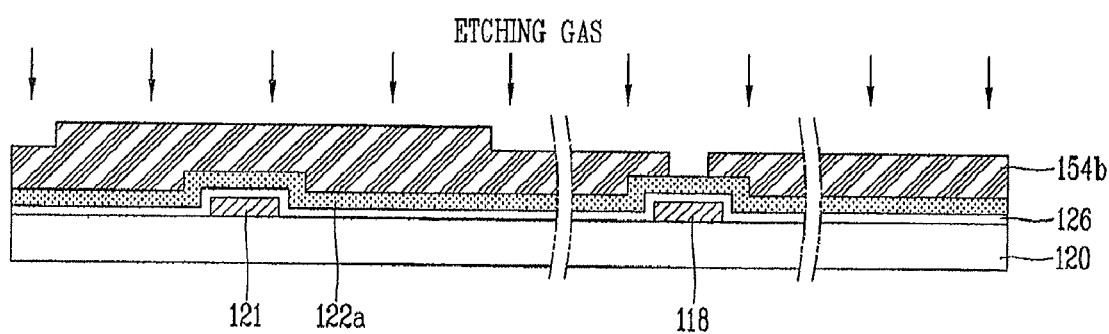

Namely, through the development of the photoresist, the photoresist pattern 154*b* exposing the oxide semiconductor layer 122*a* over the gate pad 118 is formed on the oxide semiconductor layer 122*a* as shown in FIG. 5*c*.

When the oxide semiconductor layer 122*a* is etched by using the photoresist pattern 154*b*, the exposed oxide semiconductor layer 122*a* over the gate pad 118 is etched to expose the gate insulating layer 126 on the gate pad 118. In this case, the oxide semiconductor layer 122*a* is etched according to a dry etching method in which an etching gas is applied to the oxide semiconductor layer 122*a* to etch it.

Figure 5D:
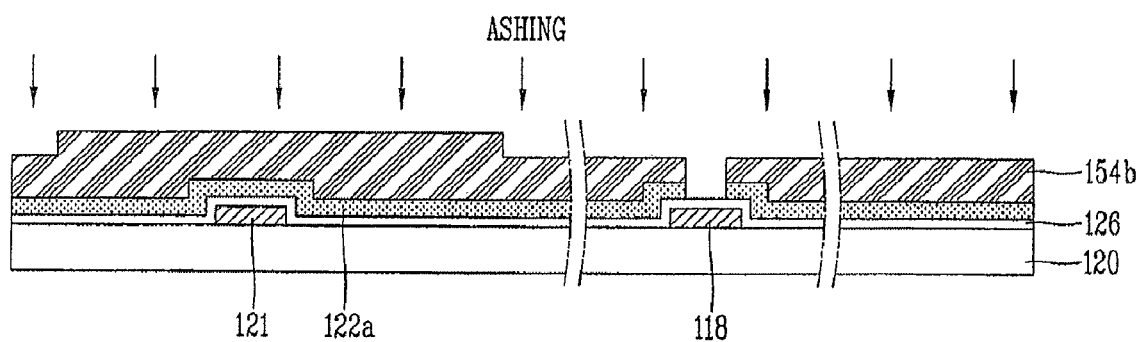
Figure 5E:
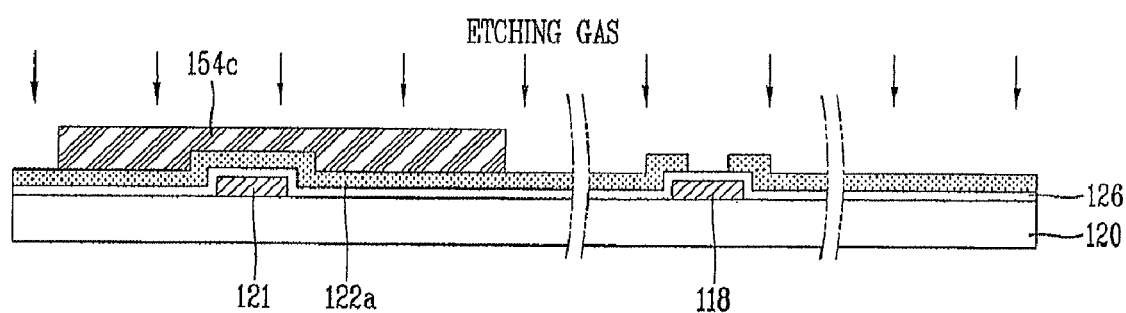

Thereafter, as shown in FIG. 5*d*, the photoresist pattern 154*b* is ashed to remove the remaining photoresist pattern 154*b* excluding the photoresist pattern 154*b* corresponding to the blocking region of the half-tone mask, and accordingly, the photoresist pattern 154*b* remains only at the region where the TFT of the pixel area is to be formed as shown in FIG. 5*e*.

In this manner, when the exposed oxide semiconductor layer 122*a* is etched through the dry etching method with the etching gas in the state that a portion of the oxide semiconductor layer 122*a* is blocked by the photoresist pattern 154*b*, the other remaining oxide semiconductor layer 122*a*, excluding the oxide semiconductor layer 122*a* below the photoresist pattern 154*b*, is completely removed. In this case, the as the oxide semiconductor layer 122*a* is etched, the gate insulating layer 126 exposed from the gate pad 118 of the gate pad area is also etched to expose the gate pad 118.

Also, the oxide semiconductor layer 122*a* may be etched according to a wet etching using an etching solution.

Meanwhile, in order to etch the oxide semiconductor layer 122*a* and the gate insulating layer 116 on the gate pad 118, a general photo mask having only a blocking region and a transmission region, rather than using the half-tone mask or the slit mask, may be used. In this case, the photoresist layer 154*a* is patterned through a photo process two times using two sheets of masks, and then, the oxide semiconductor layer 122*a* disposed over the gate pad 118 and the oxide semiconductor layer 122*a* positioned at other areas than the gate insulating layer 126 and the oxide TFT area. Namely, the photoresist layer is formed and developed by using one sheet of mask, and then, the oxide semiconductor layer 122*a* and the gate insulating layer 126 on the gate pad 118, and subsequently, a photoresist layer is formed and developed by using another mask, and then, the oxide semiconductor layer 122*a* positioned at other areas than the area where the oxide TFT is formed.

Figure 5F:
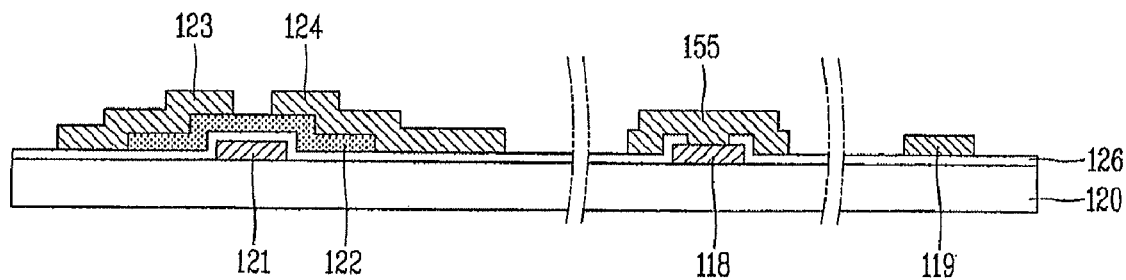

Subsequently, as shown in FIG. 5*f*, a metal such as Al, an Al alloy, Cr, Ti, Mo, etc., is deposited on the entire surface of the first substrate 120 according to a sputtering method and then etched according to a photolithography method using photoresist to form the source and drain electrodes 123 and 124 on the oxide semiconductor layer 122 of the pixel area and the metal layer 155 on the exposed gate pad 118 of the gate pad area and on a portion of the gate insulating layer 126.

Figure 5G:
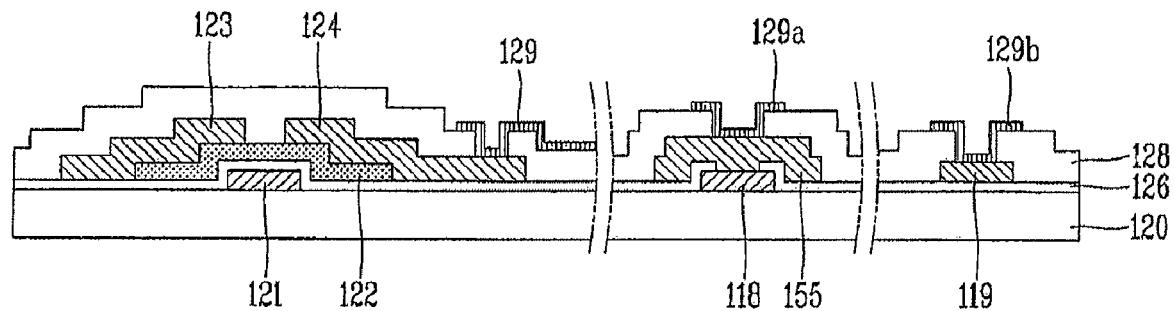

And then, as shown in FIG. 5*g*, an inorganic insulating material such as SiO2 is deposited on the entire surface of the first substrate 120 according to a PECVD method to form the passivation layer 128 and then etched by using an etching solution to form a contact hole at the passivation layer 128 on the drain electrode 124 of the pixel area and a contact hole by removing the passivation layer 128 on the metal layer 155 of the gate pad area. In addition, the passivation layer 128 on the data pad 119 of the data pad area is removed to form a contact hole therein.

In the related art LCD device having an oxide TFT, the gate insulating layer 126 and the passivation layer 128 are successively deposited on the gate pad 118, so in order to expose the gate pad 118, the passivation layer is etched according to a wet etching method and then the gate insulating layer is etched according to a dry etching method sequentially. In this case, because an overhang is generated at the passivation layer 128 according to isotropic etching of the gate insulating layer 126 at the lower portion of the passivation layer 128, the process for removing the overhang is additionally performed.

However, in the present invention, as described above, after the gate insulating layer 126 is formed and etched, the metal layer 155 is formed at the contact hole of the gate insulating layer 126 and the gate pad 118, and then, the passivation layer 128 is deposited and etched. Thus, an overhang is not generated at the passivation layer 128. Therefore, unlike the related art, the present invention does not require a process for removing an overhang, the fabrication process can be simplified.

Thereafter, a transparent conductive material such as ITO or IZO is deposited on the entire surface of the first substrate 120 and then etched according to a photolithography method to form the pixel electrode 180 on the passivation layer 128. In this case, the pixel electrode 129 is electrically connected with the drain electrode 124 of the oxide TFT via the contact hole formed at the passivation layer 128. Also, the first transparent conductive layer 129a is formed on the metal layer 155 and on a portion of the passivation layer 128 at the gate pad area, and the second transparent conductive layer 129b is formed on the data pad 119 and on a portion of the passivation layer 128 at the data pad area.

Figure 5H:
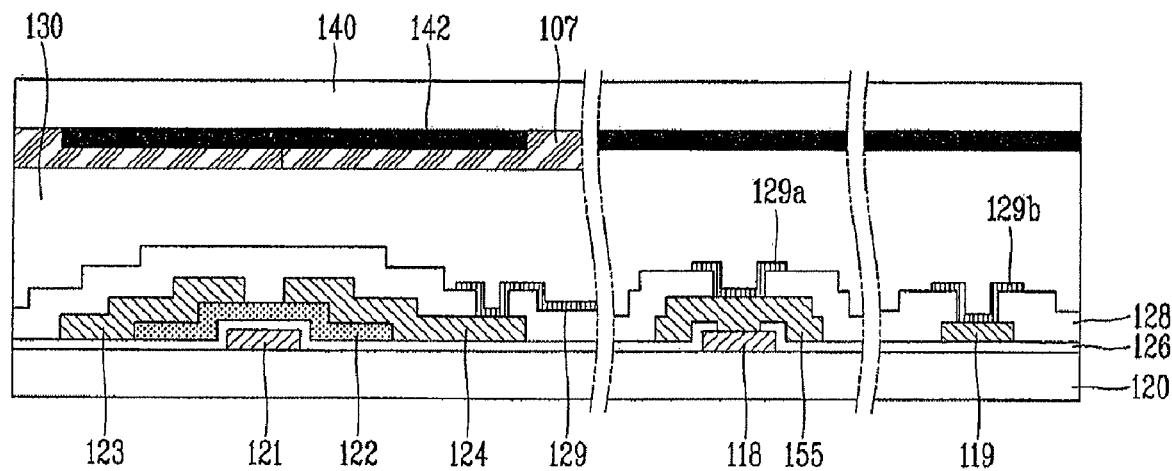

Subsequently, as shown in FIG. 5h, Cr, CrOx, or the like, is deposited on the second substrate 140 and then etched to form black matrixes at the area of the pixel area where an image is not implemented, namely, at the oxide TFT formation area, the gate line and data line formation area, the gate pad area, and the data pad area, on which a color ink or a color resin is deposited and then etched to form the color filter layer 107 including sub-color filter layers of R (Red), G (Green), and B (Blue).

And then, in a state that the liquid crystal layer 130 is disposed between the first and second substrates 120 and 140, the first and second substrates 140 are attached to complete an LCD device. The liquid crystal layer 130 is formed by applying a sealant to the first substrate 120 or the second substrate 140, attaching the first and second substrates 120 and 140 by means of the sealant, and then injecting liquid crystal through a liquid crystal injection hole. Alternatively, the liquid crystal layer 130 may be formed by dropping liquid crystal on the first substrate 120 or on the second substrate 140 such that the liquid crystal spreads over the substrates when the first and second substrates 120 and 140 are attached.

As described above, in the present invention, after the gate insulating layer 126 is formed and then etched, the metal layer 155 is formed at the contact hole of the gate insulating layer 126 and the gate pad 118, and then, the passivation layer 128 is deposited and etched. Thus, the gate insulating layer 126 and the passivation layer 128 are etched in the separate processes. Accordingly, an overhang is not generated at the passivation layer 128 due to an isotropic etching when the gate insulating layer 126 is etched, and as a result, there is no need to perform a process for removing an overhang of the passivation layer 128, thus simplifying the fabrication process.

The LCD having a particular structure has been described, but the present invention is not limited to such structure. For example, the present invention can be applicable to any display device using a TFT as a switching element such as an organic light emitting diode (OLED) display device, and can be applicable even to a display device using a silicon TFT, not such an oxide TFT. Namely, the present invention can be applicable to an LCD device and an OLED display device using a nitride insulating layer and an oxide insulating layer as the gate insulating layer and the passivation layer.

Also, the oxide semiconductor layer can be made of any known material as well as the particular material as described above.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A display device comprising:
   first and second substrates including a pixel area, a gate pad area, and a data pad area;
   an oxide thin film transistor (TFT) formed at the pixel area of the first substrate, the oxide thin film transistor including a gate electrode on the first substrate, a gate insulating layer on the whole area of the first substrate, an oxide semiconductor layer on the gate insulating layer, and source and drain electrodes on the oxide semiconductor layer;
   a gate pad and a data pad at the gate pad area and the data pad area of the first substrate;
   a metal layer on the gate insulating layer at the gate pad area and connected with the gate pad via a contact hole in the gate insulating layer;
   a passivation layer on the whole area of the first substrate;
   a pixel electrode on the passivation layer of the pixel area;
   first and second transparent conductive layers at the gate pad area and the data pad area, respectively; and
   a liquid crystal layer between the first and second substrates.

2. The device of claim 1, wherein the oxide semiconductor layer is made of oxide containing at least one of Zn, In, Ga, or their mixture.

3. The device of claim 1, wherein the gate insulating layer includes SiNx.

4. The device of claim 1, wherein the passivation layer is made of $SiO_2$.

5. The device of claim 1, wherein the metal layer is made of the same material as that of the source electrode of the oxide TFT.

* * * * *